(12) United States Patent
Jung

(10) Patent No.: US 6,852,162 B2
(45) Date of Patent: Feb. 8, 2005

(54) LASER ANNEALING APPARATUS

(75) Inventor: Yun-Ho Jung, Seoul (KR)

(73) Assignee: LG. Philips LCD Co., Ltd., Seoul (KR)

(*) Notice: Subject to any disclaimer, the term of this patent is extended or adjusted under 35 U.S.C. 154(b) by 34 days.

(21) Appl. No.: 10/211,570

(22) Filed: Aug. 5, 2002

(65) Prior Publication Data

US 2002/0185059 A1 Dec. 12, 2002

Related U.S. Application Data

(62) Division of application No. 09/697,510, filed on Oct. 27, 2000, now Pat. No. 6,514,339.

(30) Foreign Application Priority Data

Oct. 29, 1999 (KR) ......................... 1999-47532

(51) Int. Cl.[7] ................................. C30B 1/00
(52) U.S. Cl. ....................... 117/200; 117/900
(58) Field of Search ............... 117/84, 92; 118/715, 118/727, 729, 733

(56) References Cited

U.S. PATENT DOCUMENTS

| 5,788,814 | A | 8/1998 | Sun et al. |
| 6,171,641 | B1 | 1/2001 | Okamoto et al. |
| 6,215,550 | B1 | 4/2001 | Baer et al. |
| 6,340,405 | B2 | 1/2002 | Park |
| 6,638,800 | B1 * | 10/2003 | Ishihara et al. ............. 438/166 |

* cited by examiner

*Primary Examiner*—Felisa Hiteshew
(74) *Attorney, Agent, or Firm*—Birch, Stewart, Kolasch & Birch, LLP

(57) ABSTRACT

A laser annealing apparatus for sequential lateral solidification (SLS) to uniformly crystallize silicon on an entire silicon substrate by minimizing the dislocation of the silicon substrate during laser beam irradiation is disclosed. During the laser annealing, a vacuum chuck holds the silicon substrate on a movable stage. The device includes a laser source, an optical system patterning the shape and energy of a laser beam irradiated from the laser source, a vacuum chuck supporting a silicon substrate, and a movable stage supporting the vacuum chuck as well as transferring the vacuum chuck in a predetermined direction. Accordingly, the apparatus improves the degree of crystallization because it is able to uniformly carry out SLS on an entire surface of the silicon substrate.

16 Claims, 3 Drawing Sheets

LASER ANNEALING APPARATUS

This is a divisional of application Ser. No. 09/697,510, filed Oct. 27, 2000, now U.S. Pat. No. 6,514,339.

BACKGROUND OF THE INVENTION

1. Field of Invention

A laser annealing apparatus is used for sequential lateral solidification (SLS) to crystallize silicon.

2. Discussion of Related Art

Sequential laser solidification (SLS) is used for crystallizing a silicon film by using the fact that silicon grains grow perpendicularly to an interface between a liquid silicon region and a solid silicon region, i.e., into the molten silicon or melt zone. SLS differs from a conventional laser crystallization by patterning a laser beam to have a predetermined width and a predetermined shape. The SLS uses a mask for patterning a laser beam.

The process of crystallizing a silicon film by SLS is briefly explained below.

First, a silicon film is irradiated with a laser beam having a predetermined shape with sufficient energy to entirely melt a portion of the silicon. The silicon portion exposed to the laser beam resolidifies shortly after melting. During this process, silicon grains grow at an interface between a solid silicon region not exposed to the laser beam and a liquid silicon region exposed to the laser beam, and in a direction toward the liquid silicon region.

Second, the silicon film is irradiated with a laser beam having the same energy as previously used. The second irradiation occurs after the amorphous silicon film has been displaced to a distance shorter than the growing length of a silicon grain formed by the first laser beam irradiation. As a result, the silicon portion exposed to the laser beam melts, and then the silicon grain grows similarly as it did in the first laser beam irradiation. In this case, the silicon grain formed by the first laser beam irradiation works as a crystallization seed at the interface and continues to grow in the same direction as the advancing melt zone. Thus, the silicon grain grows toward the displacing direction of the laser beam.

The silicon grain is grown to the desired length by repeating n times the silicon crystallizing steps of displacing an amorphous silicon film, melting the silicon film by laser beam irradiation and solidifying the melted silicon. The silicon grain grows in the direction of laser scanning from the place of initial formation.

Accordingly, laser crystallization using SLS results in greatly extending the silicon grain size.

A typical process chamber used in a laser annealing system according to the related art is shown in FIG. 2. The process chamber is constructed with a chamber window 20-2 and a chamber wall 20-1. A support 22 supports a silicon substrate which will be irradiated with a laser beam for laser crystallization. A movable stage 21 moves the silicon substrate 23 in a predetermined direction.

In FIG. 2, the interior process chamber is sealed and evacuated to form a vacuum for laser crystallization. The chamber window 20-2 becomes an entrance through which a laser beam patterned by a laser optical system passes to the inner space of the process chamber.

In laser crystallization using SLS, the silicon substrate 23 is irradiated with a laser beam with a predetermined repetition rate, and the movable stage 21 moves in a predetermined direction. As a result, the silicon substrate 23 is scanned entirely by the laser beam.

SLS requires precise control of system variables such as transfer, uniform evenness and the like for allowing continuous growth of silicon grains without stopping. However, the conventional technology supports the silicon substrate 23 using only the support 22. The utilization of the support 22 causes the silicon substrate 23 to be unstable. A further complicating factor is the unevenness of the surface of the silicon substrate. The focal point of the laser is fixed, but the surface of the silicon substrate is uneven. As a result, the laser beam cannot uniformly irradiate the silicon substrate 23 so as to permit the continuous growth of silicon grains. The variation of the distance between the silicon substrate and the focus of the laser beam results in unevenness of laser energy with which the silicon substrate is supplied. The resulting laser crystallization, which should be carried out with continuous and uniform conditions, produces a poor result.

Further, the width of a laser beam with which the silicon substrate is irradiated varies in accordance with the distance between the silicon substrate and a focus of the laser beam. The narrower the width of the laser beam becomes, the greater the influence of the distance becomes.

Moreover, when the silicon substrate is transferred by the movable stage, minute changes of the location of silicon substrate occur. Considering that SLS is carried out under the condition that the width of the patterned laser beam and the transferring interval are within several $\mu$m, the minute dislocations of the silicon substrate fail to continuously grow the silicon grain without stopping. Thus, discontinuation of crystallization may result instead of continuous growth of the silicon grain.

As has been shown, the conventional SLS technology is hampered by discontinuities which inhibit the continuous growth of silicon grains. As a result, a technology is needed which provides smooth and even laser processing of the silicon substrate to yield continuous growth of large silicon grains using SLS.

SUMMARY OF THE INVENTION

The invention is directed to a laser annealing apparatus that substantially eliminates many of the problems due to the limitations and disadvantages of the prior art.

The invention, in part, provides a laser annealing apparatus capable of performing uniform laser crystallization on an entire silicon substrate by minimizing the dislocation of the silicon substrate during laser beam irradiation. The minimized dislocation can be achieved by installing a vacuum chuck holding the silicon substrate in a movable stage.

The invention, in part, provides a laser annealing apparatus which can carry out uniform laser crystallization on an entire silicon substrate by minimizing the unevenness of the silicon substrate. The minimized unevenness can be achieved by using a vacuum chuck that holds the silicon substrate using a vacuum attachment.

To achieve these and other advantages and in accordance with the purpose of the invention, as embodied and broadly described, the invention includes a laser source, an optical system patterning a shape and an energy of a laser beam irradiated from the laser source, and a vacuum chuck supporting a silicon substrate on which laser crystallization is performed by the patterned laser beam. The vacuum chuck holds the silicon using a vacuum. A movable stage supports the vacuum chuck and functions to move the vacuum chuck in a predetermined direction.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention, and together with the description serve to explain the principle of the invention.

DETAILED DESCRIPTION OF PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
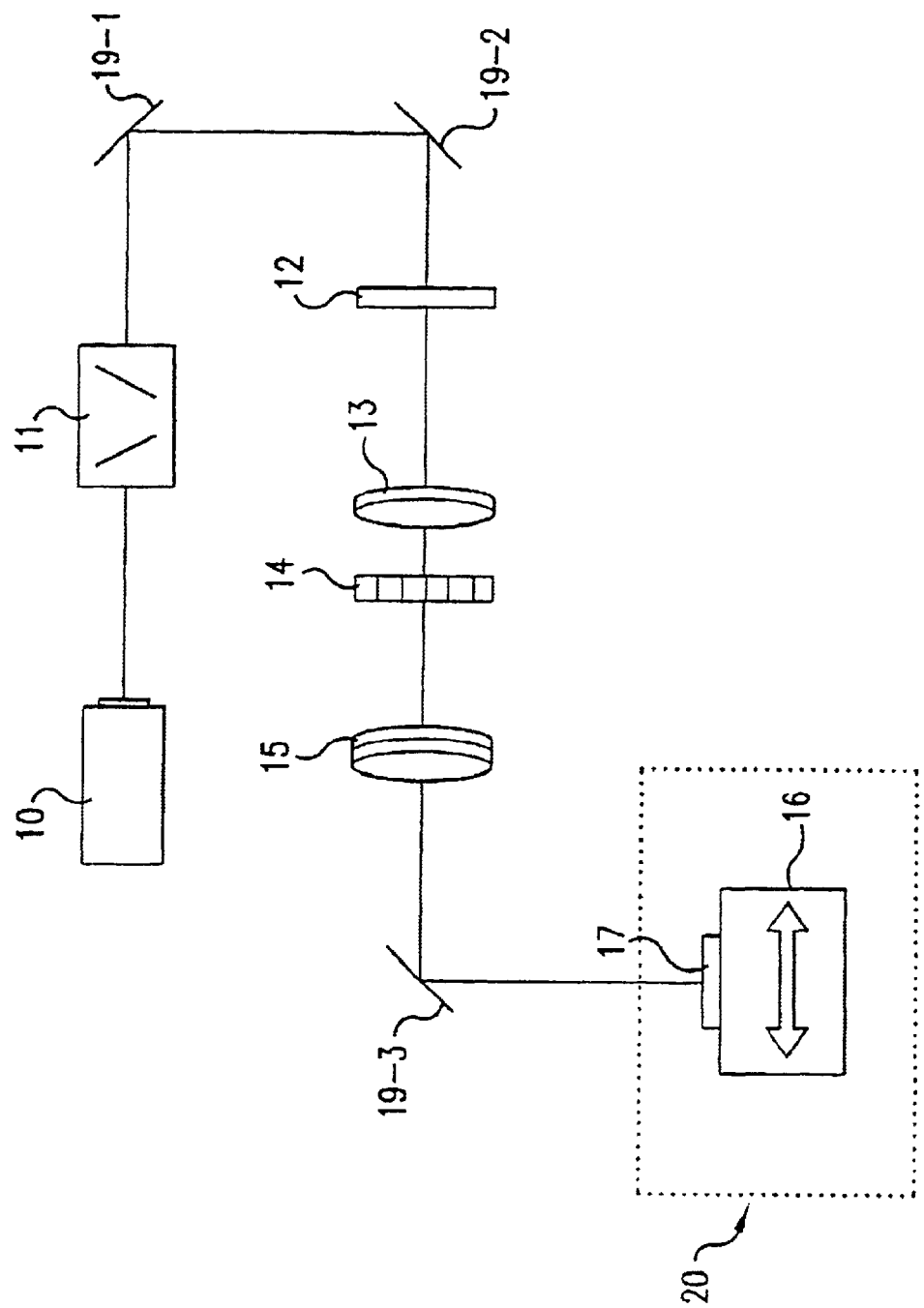
FIG. 1 shows a schematic of a laser annealing apparatus using SLS.
Figure 2:
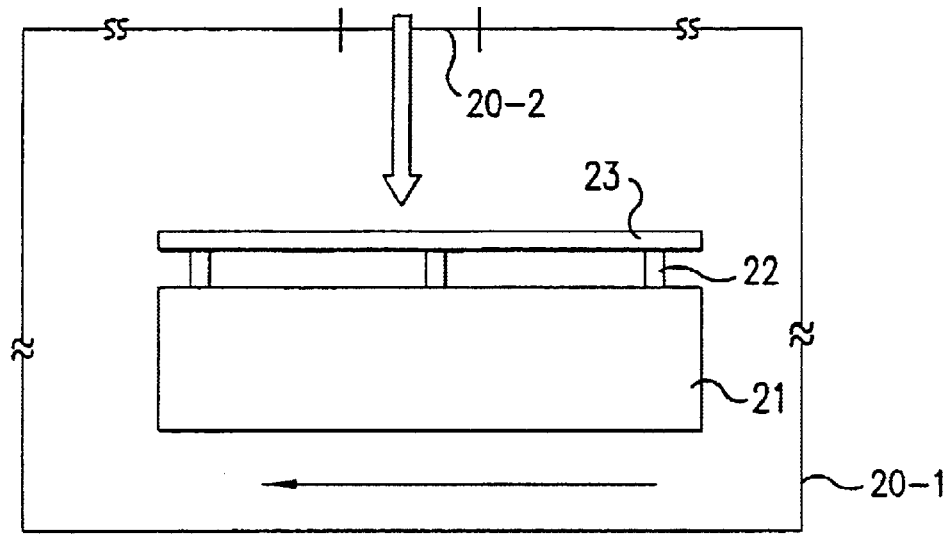
FIG. 2 shows a schematic of a process chamber in a laser annealing system according to the conventional art.

FIG. 1 shows a laser annealing apparatus for use in sequential lateral solidification (SLS).

When crystallizing a silicon film by SLS, a laser beam is patterned to a predetermined shape, and the silicon film is continuously irradiated with the patterned laser beam.

For crystallizing the silicon film, an unpatterned initial laser beam irradiates from a laser source 10 and passes through an attenuator 11, a homogenizer 12, and a field lens 13, thereby both controlling the energy of and condensing the laser beam.

The laser beam is subsequently patterned to a predetermined shape by passing the beam through a mask 14. After the patterned laser beam has passed through an object lens 15, the laser beam irradiates a silicon film 17 placed on a translation stage 16 inside a process chamber 20. Although it is formed over a substrate in a liquid crystal display, the silicon film 17 will be referred to as a silicon substrate in the following description. Mirrors 19-1, 19-2, and 19-3 are also present to control the path of the laser beam in the laser optical system.

Figure 3:
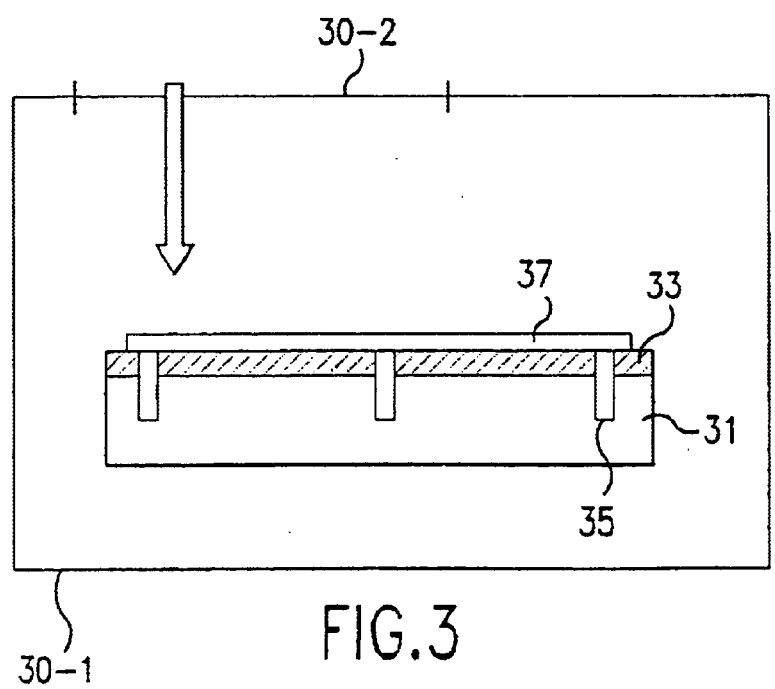
FIG. 3 shows a schematic of a process chamber in a laser annealing system according to the invention.

FIG. 3 schematically shows a process chamber of a laser annealing apparatus according to an embodiment of the present invention.

FIG. 3 shows elements of a conventional structure of a process chamber where a chamber window 30-2 and a chamber wall 30-1 provide an inner space of the process chamber. The chamber window 30-2 becomes an entrance through which a laser beam patterned by a laser optical system passes to the inner space of the process chamber.

In the process chamber, a silicon substrate 37 is installed on a movable stage 31 in the process chamber. A vacuum chuck 33 supports the silicon substrate 37 by utilizing vacuum attachment of the silicon substrate 37 to the movable stage 31. A member, e.g., a moving cylinder, 35 is installed in the vacuum chuck 33. The member 35 is used for separating and coupling the silicon substrate 37 from and with the vacuum chuck 33 by moving up and down, and the member 35 is installed in the vacuum chuck 33. The movable stage 31 fixes the vacuum chuck 33 as well as transfers the silicon substrate 37 to the left direction, to the right direction or horizontally.

The silicon substrate 37 is irradiated with a laser beam using a predetermined repetition rate, while the movable stage 31 continuously moves in a predetermined direction. As a result, the silicon substrate 37 is scanned entirely by the laser beam.

The vacuum chuck 33 in the structure of the present invention causes the silicon substrate 37 to adhere strongly. As a result, the silicon substrate is in a very stable state. Thus, any dislocation of the silicon substrate 37 is substantially prevented regardless of the transferring movement of the movable stage.

Moreover, the entire bottom face of the silicon substrate 37 is held by the vacuum chuck 33, and this strong attachment allows the silicon substrate to maintain its evenness to a certain degree despite the unevenness of the surface of the silicon substrate.

Figure 4:
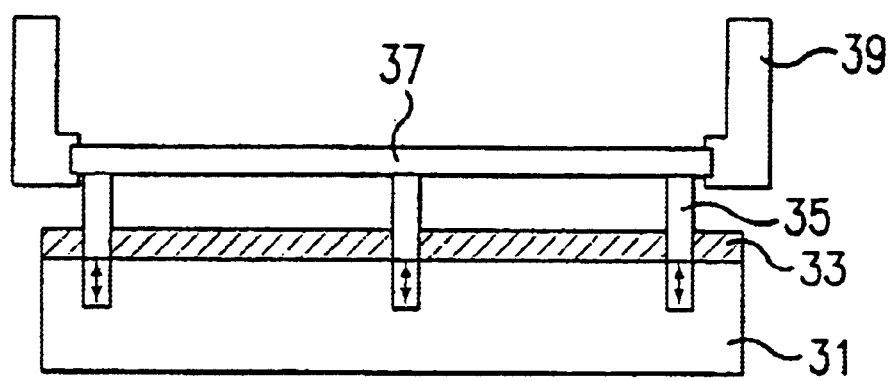
FIG. 4 shows the up and down movement of a silicon substrate in the process chamber shown in FIG. 3.

FIG. 4 explains the up and down movement of a silicon substrate in the process chamber shown in FIG. 3.

FIG. 4 shows the loading of the silicon substrate 37 when the member, e.g., moving cylinder, 35 protrudes over the vacuum chuck 33. In this mode, the silicon substrate 37 is put on the member 35 by using a robot arm 39. Then, the member 35 retracts to place the silicon substrate 37 on the vacuum chuck 33. As shown in FIG. 3, the silicon substrate 37 is held or coupled by activating the vacuum chuck 33.

By the above-explained procedure, silicon crystallization by SLS is carried out while the silicon substrate is held by a vacuum on the vacuum chuck.

When unloading the silicon substrate, the silicon substrate 37 is released by breaking the vacuum of the vacuum chuck 33. The member 35 then rises to decouple or separate the silicon substrate 37 from the vacuum chuck 33 so as to leave an interval between the vacuum chuck 33 and the silicon substrate 37. The silicon substrate 37 is then separated from the member 35 by the robot arm 39.

As described above, the laser annealing apparatus, according to the present invention, allows an optimal SLS process by providing a uniform and stable silicon substrate by holding the silicon substrate onto a chuck by using a vacuum.

The advantages achieved by the invention include maintaining evenness of the silicon substrate surface and supporting the silicon substrate strongly by holding or coupling an entire face of the silicon substrate in a vacuum state by using a vacuum chuck. Thus, the entire surface of the silicon substrate undergoes uniform exposure to a laser by leaving a highly controlled predetermined distance between the silicon substrate and the focus of a laser beam.

Accordingly, the invention markedly improves the degree of crystallization because it is able to carry out SLS on an entire surface of a silicon substrate uniformly.

It will be apparent to those skilled in the art that various modifications and variations can be made in a laser annealing apparatus of the present invention without departing from the spirit or scope of the invention. Thus, it is intended that the foregoing descriptions and specific embodiments shown herein are merely illustrative of the best mode of the invention and the principles thereof, and that modifications and additions may be easily made by those skilled in the art without departing from the spirit and scope of the invention, which is therefore understood to be limited only by the scope of the appended claims.

What is claimed is:

1. A laser annealing apparatus comprising:
   a laser source,
   a vacuum chuck supporting a substrate, and
   a movable stage supporting the vacuum chuck.

2. A laser annealing apparatus comprising:
   a laser source,
   a vacuum chuck supporting a substrate,
   a movable stage supporting the vacuum chuck, and
   at least one movable member installed in the vacuum chuck, the movable member being operable to move up and down in the vacuum chuck to couple and decouple the substrate with the vacuum chuck.

3. The apparatus according to claim 2, wherein the member is a cylinder.

4. The apparatus according to claim 1, which further comprises, between the laser source and the substrate: an attenuator, a homogenizer and a field lens.

5. The apparatus according to claim 1, which further comprises, between the field lens and the substrate: a mask and an object lens.

6. A laser annealing apparatus comprising:
   a laser source,
   a vacuum chuck supporting a substrate,
   a movable stage supporting the vacuum chuck, and
   a process chamber containing the vacuum chuck, the movable stage and the substrate.

7. The apparatus according to claim 6, wherein the process chamber comprises a chamber window and a chamber wall providing an inner space.

8. A laser annealing apparatus comprising:
   a laser source,
   a vacuum chuck supporting a substrate,
   a movable stage supporting the vacuum chuck, and
   a robot arm to place and separate the substrate on the vacuum chuck.

9. The apparatus according to claim 8, wherein the substrate is silicon.

10. A laser annealing apparatus comprising:
    a laser source,
    a vacuum chuck supporting a substrate, and
    a movable stage supporting the vacuum chuck, wherein the substrate is silicon.

11. An apparatus for crystallizing a non-crystalline material, comprising:
    a laser source for irradiating laser beam to a portion of the non-crystalline material;
    a movable stage for moving the non-crystalline material to irradiate the laser beam to the next portion of the non-crystalline material, thereby the irradiated portion of the non-crystalline material is sequentially crystallized from the crystalline portion of the non-crystalline material;
    a vacuum chuck formed in the movable stage to adhere the substrate; and
    loading member for loading the substrate to the movable stage.

12. The apparatus according to claim 11, further comprising:
    laser patterning means for patterning the laser beam emitted from the laser to crystallize a portion of the non-crystalline material corresponding to the patterned laser beam.

13. The apparatus according to claim 12, wherein the laser patterning means includes a patterned mask.

14. The apparatus according to claim 11, wherein the non-crystalline material includes an amorphous silicon.

15. The apparatus according to claim 14, wherein the amorphous silicon includes a substrate.

16. A laser annealing apparatus comprising:
    a laser source;
    a movable stage supporting a substrate;
    a vacuum chuck for adhering the substrate to the movable stage; and
    at least one movable member installed in the vacuum chuck, the movable member being operable to move up and down in the vacuum chuck to couple and decouple the substrate with the vacuum chuck,
    wherein the sliding of the substrate on the movable stage is prevented by the adhering force of the vacuum chuck.

* * * * *